United States Patent [19]
Cheah et al.

[11] Patent Number: 6,040,626
[45] Date of Patent: Mar. 21, 2000

[54] SEMICONDUCTOR PACKAGE

[75] Inventors: Chuan Cheah, El Segundo; Jorge Munoz, Cypress; Dan Kinzer, El Segundo, all of Calif.

[73] Assignee: International Rectifier Corp., El Segundo, Calif.

[21] Appl. No.: 09/225,153

[22] Filed: Jan. 4, 1999

Related U.S. Application Data

[60] Provisional application No. 60/101,810, Sep. 25, 1998.

[51] Int. Cl.[7] .......................... H01L 23/48; H01L 23/52; H01L 29/40
[52] U.S. Cl. .......................... 257/735; 257/692; 257/666; 257/341
[58] Field of Search ................................ 257/735, 736, 257/776, 692, 666, 341

[56] References Cited

U.S. PATENT DOCUMENTS

| | | |
|---|---|---|
| 4,189,342 | 2/1980 | Kock . |
| 4,935,803 | 6/1990 | Kalfus et al. . |
| 5,218,231 | 6/1993 | Kudo . |
| 5,266,834 | 11/1993 | Nishi et al. . |
| 5,665,996 | 9/1997 | Williams et al. ........................ 257/401 |
| 5,814,884 | 9/1999 | Davis et al. . |

FOREIGN PATENT DOCUMENTS

| | | |
|---|---|---|
| 0720225 | 7/1996 | European Pat. Off. . |
| 0720234 | 7/1996 | European Pat. Off. . |

*Primary Examiner*—Sheila V. Clark
*Attorney, Agent, or Firm*—Ostrolenk, Faber, Gerb & Soffen, LLP

[57] ABSTRACT

A semiconductor package includes a bottom leadframe having a bottom plate portion and at least one first terminal extending from the bottom plate portion; at least one second terminal being co-planar with the first terminal; a semiconductor power MOSFET die having a bottom surface defining a drain connection and a top surface on which a first metalized region defining a source and a second metalized region defining a gate are disposed, the bottom surface being coupled to the bottom plate of the leadframe such that the first terminal is electrically connected to the drain; a copper plate coupled to and spanning a substantial part of the first metalized region defining the source connection; and at least one beam portion being sized and shaped to couple the copper plate portion to the at least one second terminal such that it is electrically coupled to the source.

28 Claims, 10 Drawing Sheets

SEMICONDUCTOR PACKAGE

CROSS REFERENCE TO RELATED APPLICATION

This application is based on and claims priority to U.S. Provisional patent application No. 60/101,810, filed Sep. 25, 1998, entitled SEMICONDUCTOR PACKAGE, the entire disclosure of which is incorporated herein by reference.

BACKGROUND OF THE INVENTION

1. Field of the Invention

The present invention is related to a semiconductor package in which a semiconductor die is disposed between upper and lower plate members and, more particularly, to an S08 semiconductor package in which a source of a MOSFET semiconductor die is electrically coupled to a leadframe via an upper plate member while the MOSFET gate is electrically coupled to the leadframe via a wire bond.

2. Related Art

With reference to FIG. 1, a semiconductor package 10 according to the prior art is shown. The semiconductor package 10 includes a bottom plate portion 13 and terminals 12a, 12b. A semiconductor die 16 is disposed on top of the bottom plate portion 13 and fastened thereto, typically using an epoxy material. The semiconductor die 16 includes a metalized region 18 (typically aluminum) defining a connection area for a top surface of the semiconductor die 16. Portions of the terminals 12a, 12b, bottom plate portion 13, and semiconductor die 16 are encapsulated in a housing 22, typically formed from a moldable material. In order to obtain an electrical connection between the metalized region 18 and the terminal(s) 12b, one or more wires 20 are ultrasonically bonded at one end 21a to the metalized region 18 and at a distal end 21b to the terminal 12b.

FIG. 2 shows another semiconductor package 100 of the prior art. In order to electrically connect the metalized region 18 with the terminal 12b, one or more wires 24 are stitch bonded at locations 23, thereby providing additional paths for current to flow from the semiconductor die 16 to the terminal 12b. This marginally reduces the resistance of the current path from the semiconductor die 16 to the terminal 12b.

It is desirable to significantly reduce the resistance and inductance of current paths through a power semiconductor package in order to ensure optimum performance of the semiconductor device. Unfortunately, the semiconductor packages of the prior art do not fully achieve this objective because, among other things, the distance D between one area of the metalized region 18 and the end 21a of the wires 20 increases the resistance of the current path from the metalized region 18 to the terminal 12b. This problem is exacerbated when the thickness of the metalized region 18 is relatively small (typically, the thickness is approximately 4 to 8 microns). The relatively thin metalized region 18 in combination with the distance D and the cross sectional profile of the wire bond 20 results in a relatively high resistance and inductance for the current path therethrough.

In some packages (for example S08 packages) the distance D is approximately 80 to 100 mils resulting in a resistance of between about 0.79 and 1.58 mohms for the metalized region 18. The diameters of the wires 20, 24 are approximately 2 mils yielding resistances of about 1.05 mohms (when 14 wires are used). With terminal and epoxy resistances aggregating to about 0.307 mohms, such packages exhibit total resistances of between about 2.14 to 2.93 mohms. The resulting package thermal resistance, RJA, can reach 62.5° C./W.

When the semiconductor package 10 includes, for example, a MOSFET semiconductor die 16, the resistance caused by the distance D and the relatively small diameter of the wires 20, 24 adds to the overall resistance of the MOSFET. Indeed, when die 16 is a MOSFET die, the terminals 12a are typically coupled to the drain of the MOSFET while the terminals 12b are coupled to the source of the MOSFET via one or more wire bonds 20. As ON resistances of MOSFET dies become smaller and smaller, the resistance caused by the distance D and the wire bonds 20, 24 become a larger and larger portion of the overall resistance from one terminal 12a to another terminal 12b. Of course, the high frequency performance of a semiconductor device, like a MOSFET, is significantly effected by the resistance and inductance from terminal to terminal through the device.

Some prior art packages have incorporated a large metal strap to obtain an electrical connection between the metalized region 18 and terminal 12b. Unfortunately, this technique has only been possible in large semiconductor packages having relatively simple surface structures, such as bipolar junction transistors, diodes, and thyristors. Further, the metal straps were not practical in small outline packages (such as S08, surface mount dual in line packages).

The use of a large metal strap in a MOS-gated device, such as a MOSFET, has not heretofore been achieved because such devices have relatively complex surface structures. In particular, MOS-gated devices typically include a gate runner (or bus), disposed on the surface of the semiconductor die, which traverses the surface such that gate potential is distributed over the surface of the die. Consequently, disposing a large metal strap over the surface of the die has been problematic because the gate runner restricts access to the die surface and could be shorted to the metal strap. Thus, the use of metal straps in MOS-gated semiconductor devices has been prohibitive.

Accordingly, there is a need in the art for a new semiconductor package which overcomes the deficiencies in the prior art semiconductor packages by, among other things, reducing the resistances of the current paths through MOS-gated devices and reducing the inductances of such current paths.

SUMMARY OF THE INVENTION

In order to overcome the deficiencies of the prior art, a semiconductor package according to one aspect of the instant invention includes a bottom leadframe having a bottom plate portion and at least one first terminal extending from the bottom plate portion; at least one second terminal being co-planar with the first terminal; a semiconductor power MOSFET die having a bottom surface defining a drain connection and a top surface on which a first metalized region defining a source and a second metalized region defining a gate are disposed, the bottom surface being coupled to the bottom plate of the leadframe such that the first terminal is electrically connected to the drain; a copper plate coupled to and spanning a substantial part of the first metalized region defining the source connection; and at least one beam portion being sized and shaped to couple the copper plate portion to the at least one second terminal such that it is electrically coupled to the source.

BRIEF DESCRIPTION OF THE DRAWINGS

For the purpose of illustrating the invention, there are shown in the drawing forms which are presently preferred, it being understood, however, that the invention is not limited to the precise arrangements and instrumentalities shown.

DETAILED DESCRIPTION OF THE PREFERRED EMBODIMENTS

Figure 1:
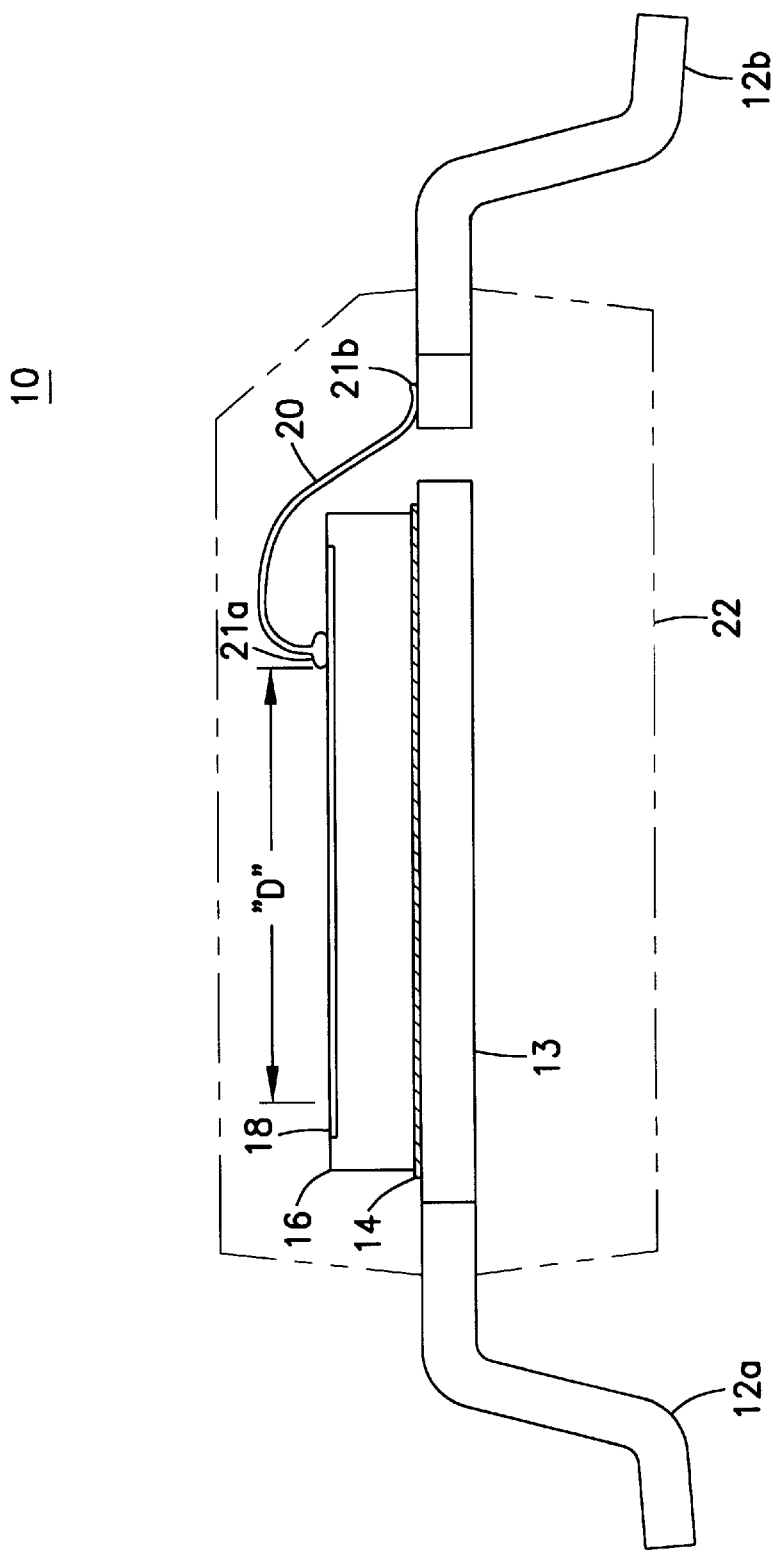
FIG. 1 is a side view of a semiconductor package according to the prior art.
Figure 2:
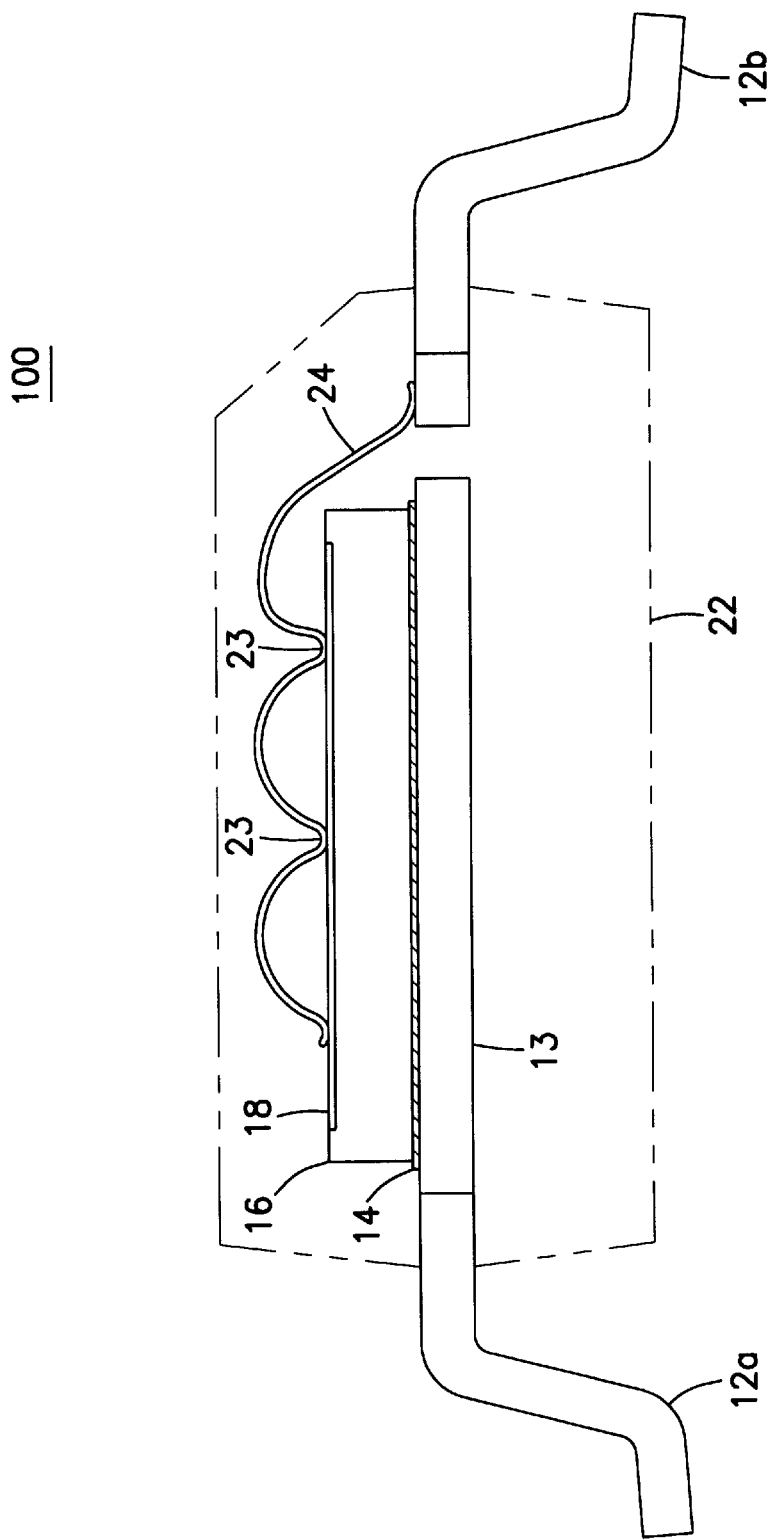
FIG. 2 is a side view of a semiconductor package according to the prior art.
Figure 3:
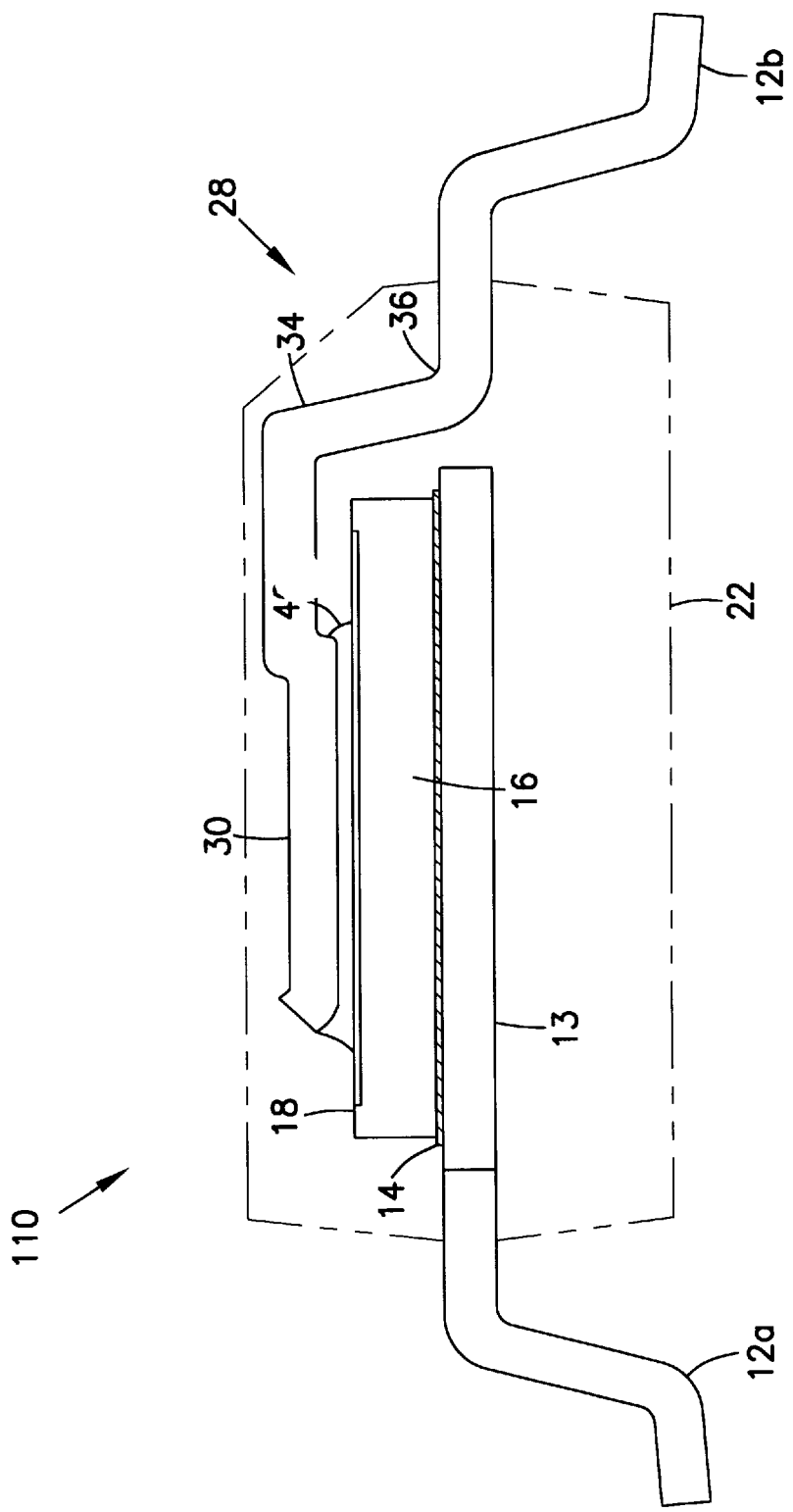
FIG. 3 is a side view of a semiconductor package according to the present invention.

Referring now to the drawing wherein like numerals indicate like elements, there is shown in FIG. 3 a perspective view of a semiconductor package 110 in accordance with one aspect of the present invention. The semiconductor package 110 includes a semiconductor die 16 having a bottom surface coupled to a bottom plate 13. Preferably, the semiconductor die 16 is a MOSFET die and terminals 12a are electrically coupled to the drain of the MOSFET die 16. Of course, the semiconductor die 16 may take on other forms, such as diodes, insulated gate bipolar transistors, or the like.

The semiconductor die 16 includes a top surface having a metalized region 18 which defines a connection to the semiconductor die 16. For example, when the semiconductor die 16 is a MOSFET, metalized region 18 may define a source connection.

The semiconductor package 110 also includes a strap member 28 which is employed to electrically couple the metalized region 18 to the terminals 12b. Each strap member 28 preferably includes a substantially thick plate portion 30 and a shaped beam portion 34. The plate portion 30 is preferably formed of copper and spans a substantial portion of the metalized region 18. The beam portion 34 is shaped and sized to couple the plate portion 30 to the terminals 12b.

Preferably, the beam portion 34 is coupled, at one end, to a lateral edge of the plate portion 30 and includes a distal end 36 which is coupled to a respective terminal 12b.

A curable conductive material 46 (such as silver filled conductive epoxy) is preferably disposed between the lower surface of the plate portion 30 and the metalized region 18 such that the plate 30 is firmly coupled to the metalized region 18. Soft solder may also be used.

It is preferred that the semiconductor package 110 include a housing 22 formed from a moldable material (such as plastic) and that the package configuration conforms to the S08 standard.

Advantageously, the strap member 28 provides a relatively large contact area for coupling the terminal 12b to the metalized region 18, thereby reducing resistance to current flow and reducing inductance. This provides for improved performance at high frequencies. Further, this structure also enjoys the advantage of providing a thermal path for heat to escape the semiconductor die 16 through the strap member 28.

Figure 4:
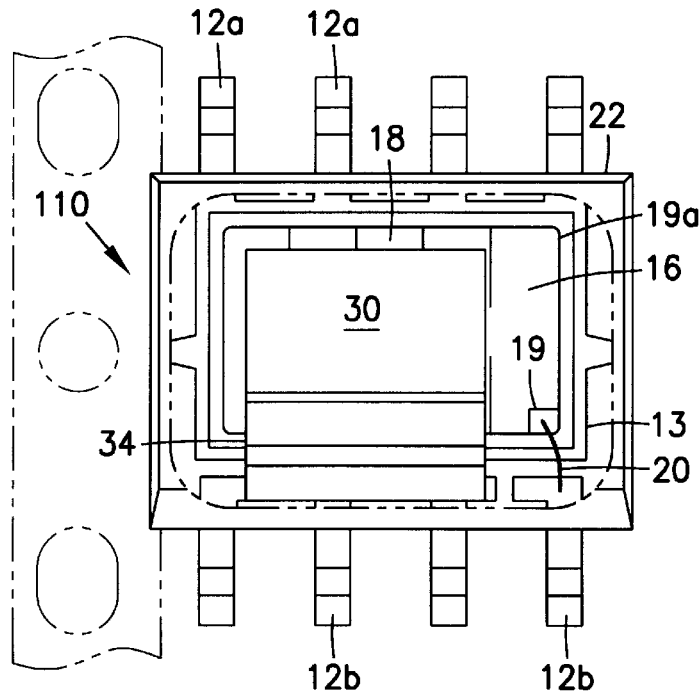
FIG. 4 is a top plan view of an alternative embodiment of the semiconductor package shown in FIG. 3.
Figure 5:
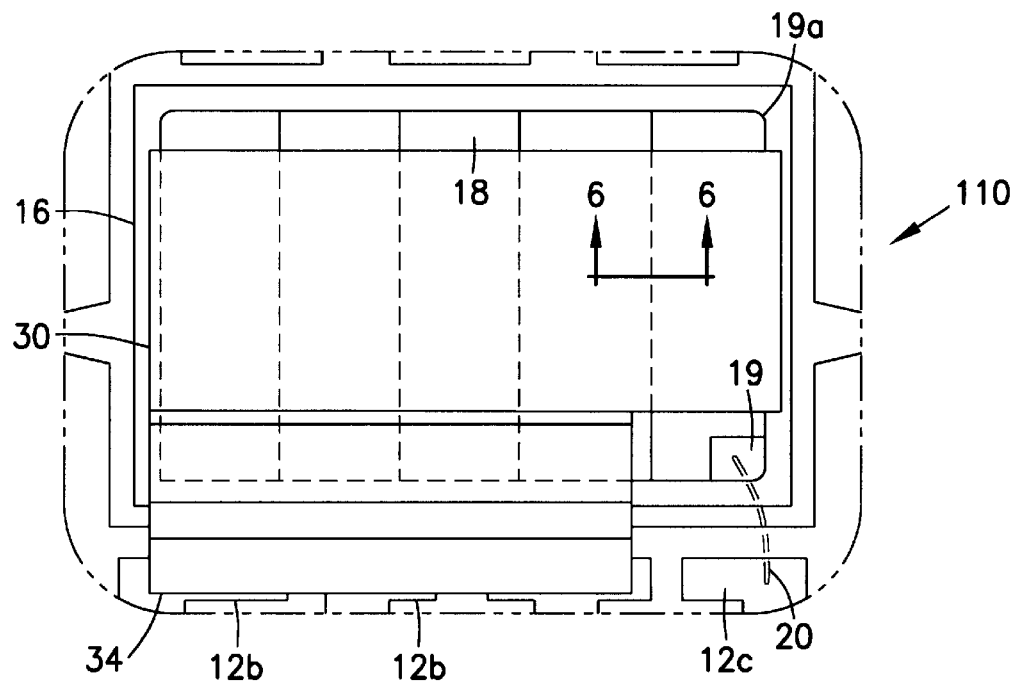
FIG. 5 is a top plan view of an alternative embodiment of the semiconductor package of FIG. 4.
Figure 4A:
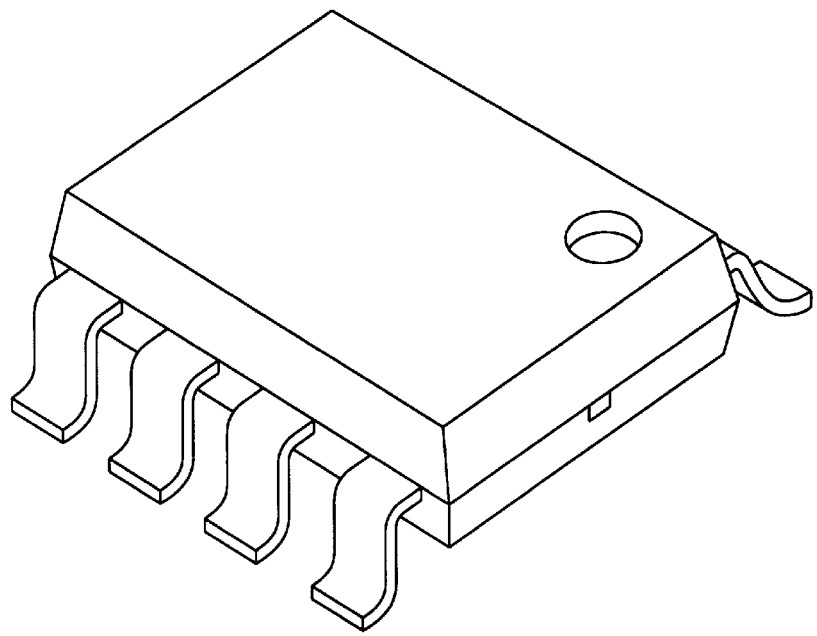
FIGS. 4a–4c are perspective views of the semiconductor package of FIG. 4.
Figure 4B:
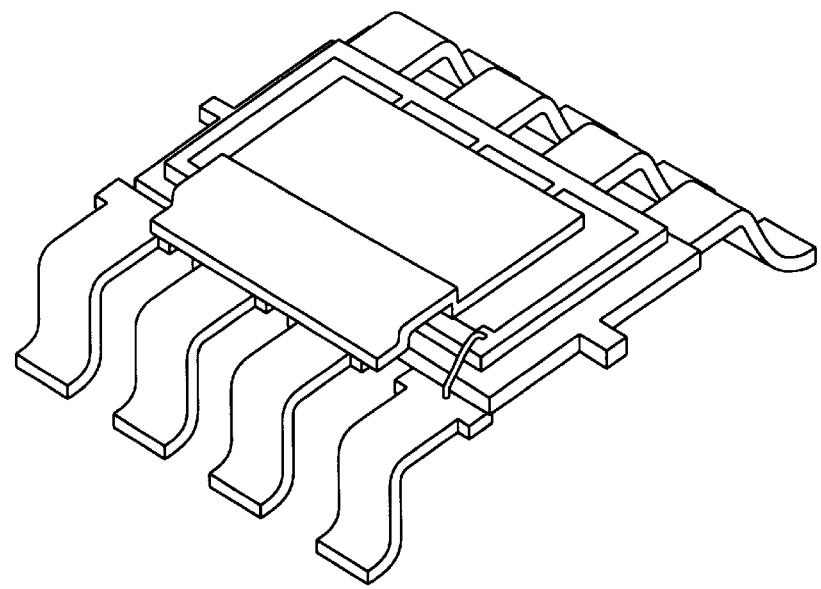
Figure 4C:
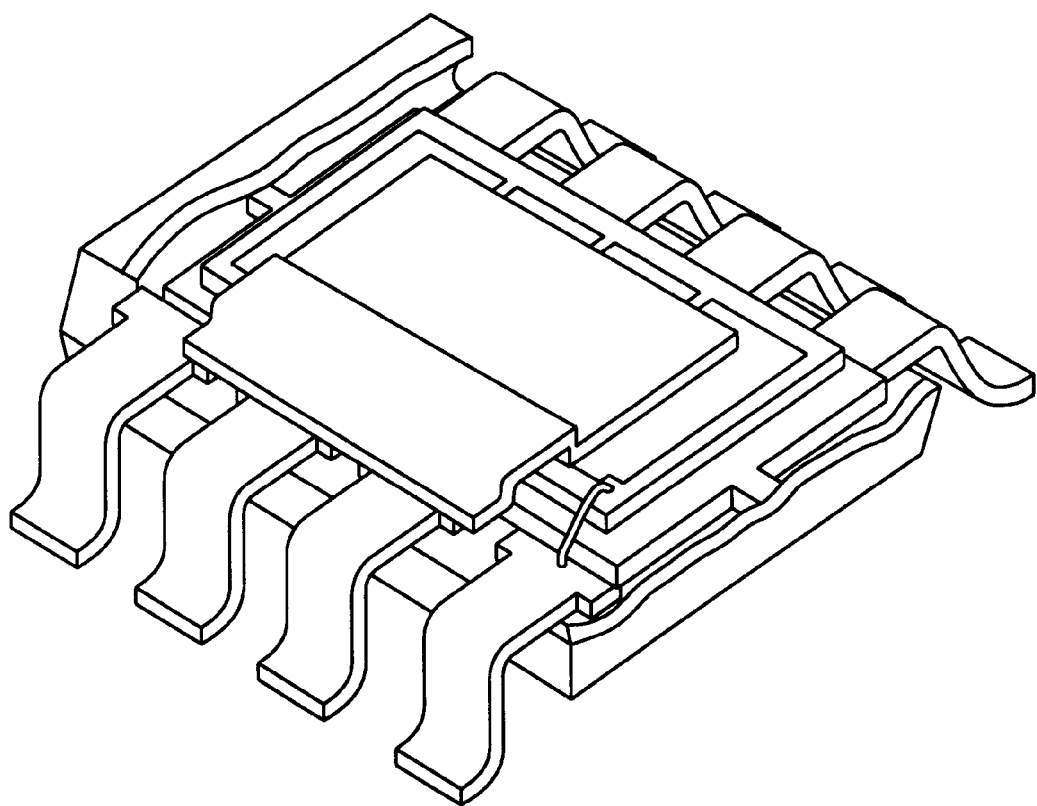

As best seen in FIGS. 4 and 5, which show top plan views of the semiconductor package 110, the beam portion 34 is preferably integrally formed into one flowing member which extends from one lateral edge of the plate portion 30 and terminates at the terminals 12b. FIGS. 4a–4c are perspective views of the package of FIG. 4.

A metalized region 19 defines a gate of the MOSFET die 16. The metalized region 19 is electrically coupled to one terminal 12b via wire bond 20. Thus, the present invention employs a mixed connection to the MOSFET die 16 top surface, namely, a low resistance plate portion 30 for connecting to the source and a wire bond 20 for connecting to the gate 19.

As best seen in FIG. 5, a gate runner (or bus) 19a couples the gate metalized region 19 to the source areas of the surface of the die 16. It is preferred that the plate portion 30 extend laterally beyond outermost portions of the gate runner 19a. It is also preferable that the plate portion 30 extend beyond and cover as much of the gate runner 19a as possible. This ensures that improved performance is achieved.

Figure 6:
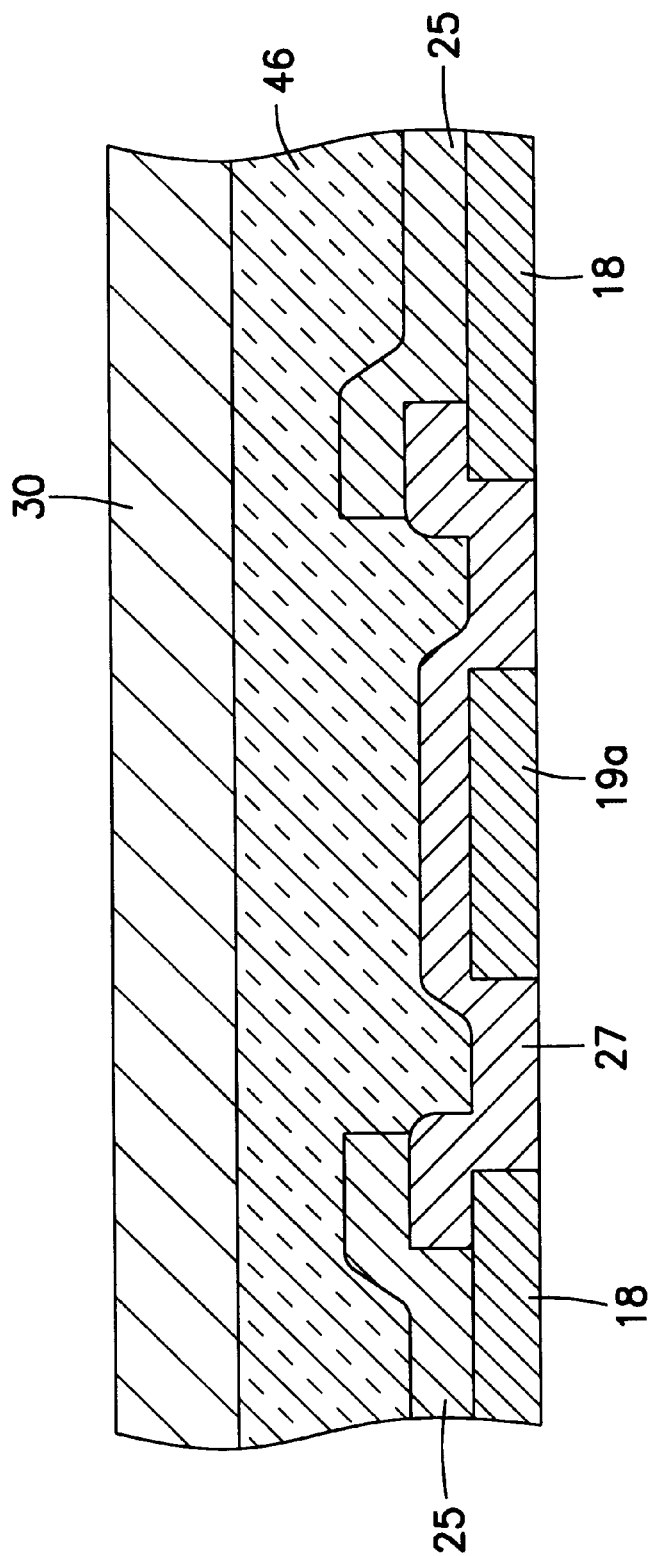
FIG. 6 is a sectional view of the semiconductor package of FIG. 5 taken along line 6—6.

FIG. 6 shows a sectional view taken along line 6—6 of FIG. 5. A portion of the gate runner 19a is shown disposed between metalized region 18. Preferably, a solderable metal (such as TiNiAg) is disposed on top of the metalized region 18. In order to insulate the gate runner 19a from the plate portion 30, a nitride layer 27 is disposed on top of the gate runner 19a. The curable conductive material 46 (preferably silver filled epoxy) is disposed on top of the solderable metal 25 and electrically and mechanically couples the plate portion 30 to metalized regions 18. Advantageously, the plate portion 30 is electrically and thermally coupled to the metalized regions 18 without interfering with the gate runner 19a.

It is noted that the plate portion 30 may be soldered to the solderable metal 25 if desired. It is preferred, however, that the silver filled epoxy 46 be employed to couple the plate portion 30 to the metalized region 18. When conductive epoxy 46 is employed, it is noted that the solderable metal 25 may be eliminated and the epoxy may directly contact the metalized region 18.

Figure 7:
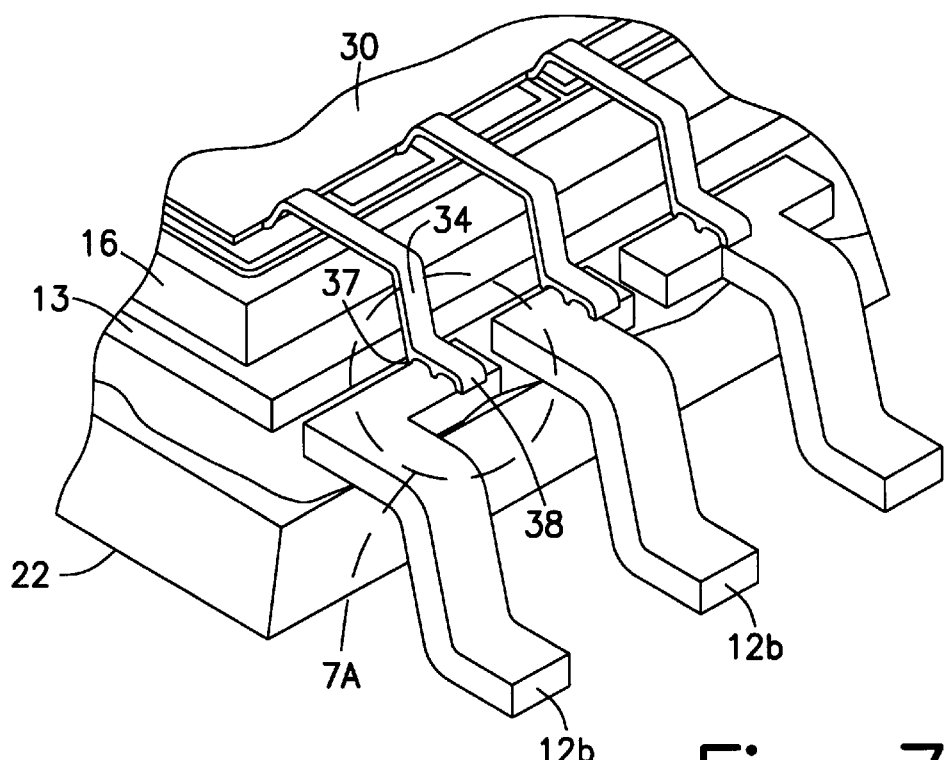
FIG. 7 is a cut-away perspective view of an alternative embodiment of the semiconductor package of the instant invention.
Figure 7A:
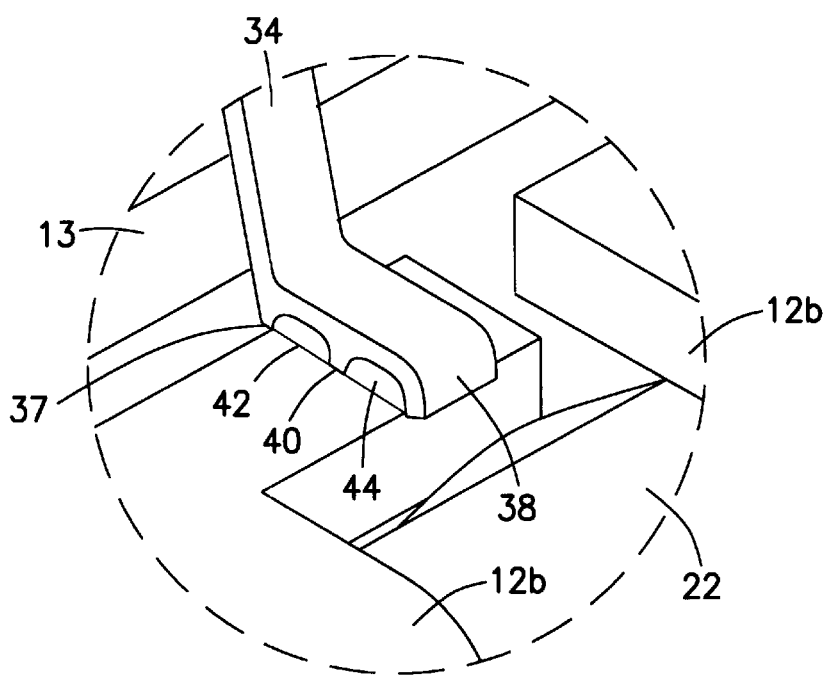

Reference is now made to FIG. 7 which shows an alternative embodiment of the present invention. In particular, the distal end of the beam portion 34 includes a heel 37 and toe 38 which creates a void 42 proximate to the terminal 12b. Preferably, the distal end of the beam portion 34 includes a downwardly directed projection 40 which extends through the void 42 toward the terminal 12b. It is preferred that curable conductive material 44 is introduced into the void 42 to facilitate electrically and mechanically coupling the distal end of the beam portion 34 to the terminal 12b. A suitable curable conductive medium 44 for use with the present invention may be selected from any of the known conductive epoxies or the like (silver filled epoxy being preferred).

Figure 8:
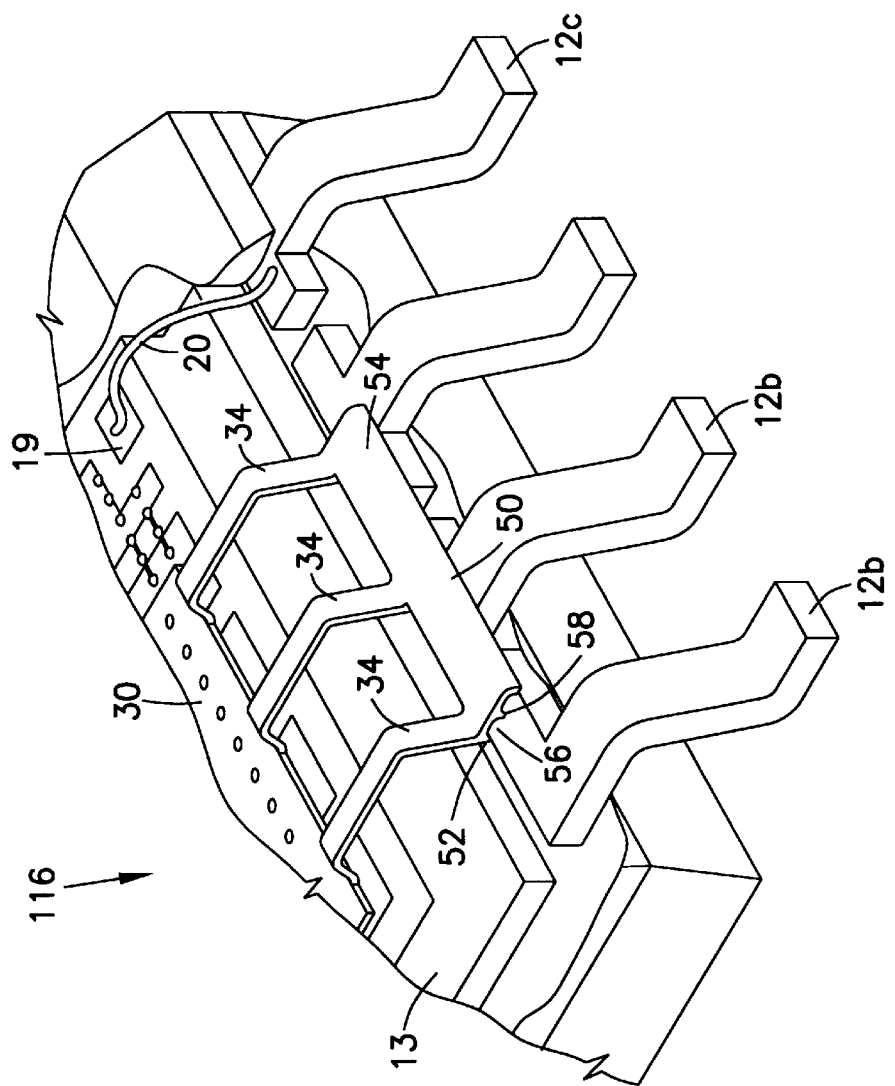
FIG. 8 is a cut-away perspective view of another alternative embodiment of the semiconductor package according to the instant invention.
Figure 9:
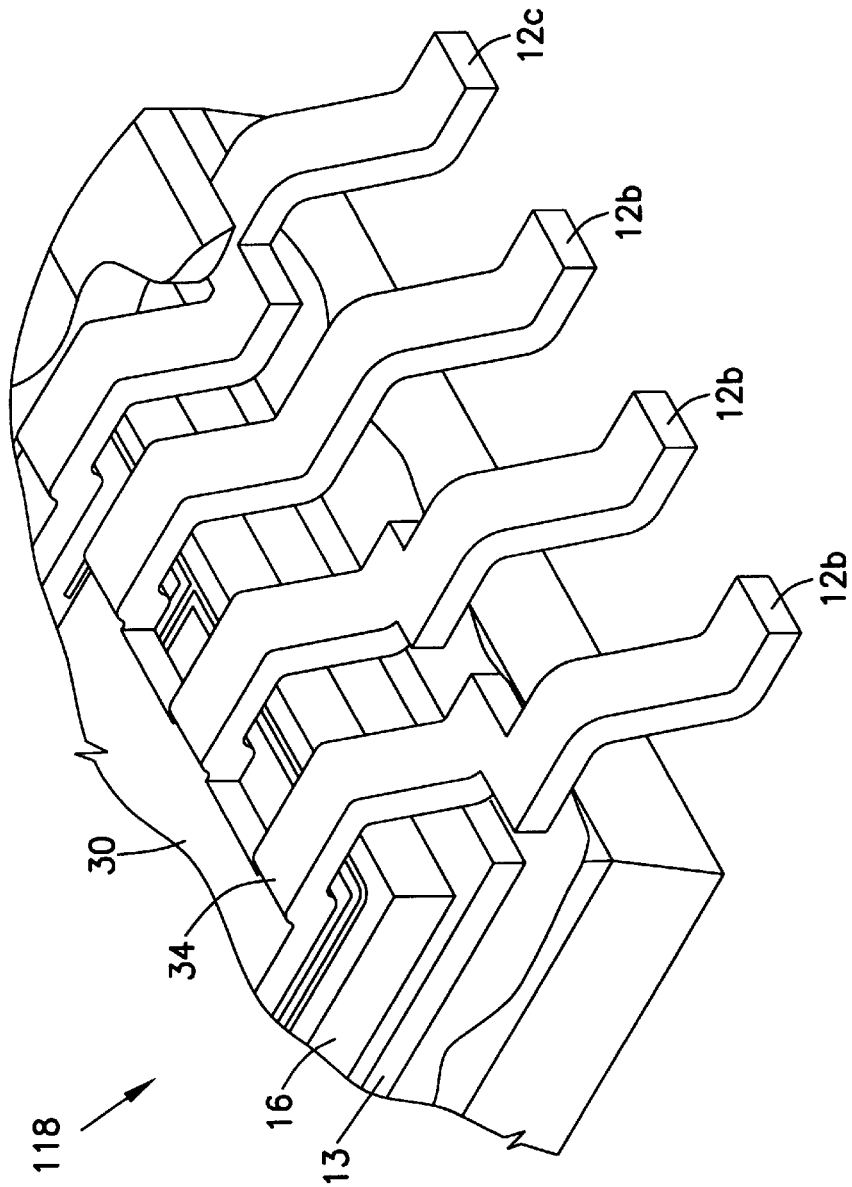
FIG. 9 is a cut-away perspective view of still another alternative embodiment of the semiconductor package according to the instant invention.

Reference is now made to FIG. 9 which shows a cut-away perspective view of a semiconductor package 116 according to another aspect of the present invention. The semiconductor package 116 of FIG. 8 is substantially the same as the packages of the previous embodiments except that the plurality of beam portions 34 terminate at a cross bar portion 50. The cross bar portion 50 is coupled to at least two terminals 12b.

Preferably, the cross bar portion 50 includes a longitudinal heel 52 and a longitudinal toe 54 defining a void located proximate to the terminals 12b. The void 56 is in the form of a channel extending for substantially the entire length of the cross bar portion 50. It is preferred that the cross bar portion 50 include a downwardly directed projection 58 (in the form of a wall) extending through the channel toward the terminals 12b. A layer of curable conductive material (such as conductive epoxy) is preferably disposed within the channel to couple the cross bar portion 50 to the terminals 12b.

Reference is now made to FIG. 8 which show a cut-away perspective view of a semiconductor package 118 according to another embodiment of the present invention. The semiconductor package 118 is similar to the previous embodiments of the present invention except that the plate portion 30, beam portions 34 and terminals 12b are all integrally coupled and preferably formed from a common sheet of material. Thus, terminal 12b extends from outside the housing 22 into an interior of the housing and substantially over the top portion of the semiconductor die 16 to sandwich the semiconductor die 16 between the top and bottom plate portions 30 and 13, respectively.

It is noted that the metalized regions 18 may be formed from a solderable metal (such as copper, gold, silver, or the like) and that a plurality of flowable conductive bumps (preferably solder bumps, not shown) may be disposed on the surface of the metalized regions 18. Further, the plate portion 30 may include a lower surface which is oriented in an opposing fashion to the flowable conductive bumps such that the plate portion 30 may electrically and/or mechanically engage the flowable conductive bumps and the metalized regions 18.

The lower surface of the plate portion 30 may also include one or more downwardly directed projections extending from the plate portion 30 towards the flowable conductive bumps and the metalized regions 18.

It has been found that when that plate portion 30 is about 0.108×0.104 mils, the resistance introduced into the package is only about 0.115 mohms. Using metalized regions 18 aggregating about 0.08 mohms, the total package resistance according to the invention is only about 0.506 mohms (a 50% to 75% improvement over the prior art packages). Further, the thermal resistance RJA of the package of the instant invention is only about 46° C./W max (a 25% reduction over the prior art packages).

The foregoing description of the preferred embodiments of the present invention have been provided for the purposes of illustration and description. It is not intended to be exhaustive or to limit the invention to the precise forms disclosed. Many modifications and variations are possible in light of the above teaching. It is intended that the scope of the invention be limited not be this detailed description, but rather by the claims appended hereto.

What is claimed is:

1. A power semiconductor package, comprising:
   a bottom leadframe having a bottom plate portion and at least one first terminal extending from the bottom plate portion;
   at least one second terminal being co-planar with the first terminal;
   a third terminal;
   a semiconductor power MOSFET die having a bottom surface defining a drain connection and a top surface on which a first metalized region defining a source and a second metalized region defining a gate are disposed, the bottom surface being coupled to the bottom plate of the leadframe such that the first terminal is electrically connected to the drain;
   a copper plate coupled to and spanning a substantial part of the first metalized region defining the source connection;
   at least one beam portion being sized and shaped to couple the copper plate portion to the at least one second terminal such that it is electrically coupled to the source; and
   a wire bond coupling the gate to a third terminal.

2. The power semiconductor package of claim 1, further comprising a layer of curable conductive material disposed between the copper plate and the first metalized region such that the copper plate portion is firmly coupled to the source.

3. The power semiconductor package of claim 1, wherein the copper plate includes a top surface and a bottom surface, the bottom surface having downwardly directed projections extending towards the source.

4. The power semiconductor package of claim 1, wherein the MOSFET die includes a gate bus extending over portions of the source, the copper plate covering substantially all of the gate bus.

5. The power semiconductor package of claim 1, wherein the MOSFET die includes a gate bus extending over portions of the source, further comprising a nitride layer substantially covering at least a portion of the gate bus, the copper plate being electrically insulated from the gate bus via the nitride layer.

6. The power semiconductor package of claim 5, further comprising a layer of curable conductive material disposed between the copper plate and the source.

7. The power semiconductor package of claim 6, wherein the nitride layer electrically insulates the gate bus from the curable conductive material.

8. The power semiconductor package of claim 7, wherein the curable conductive material is silver filled epoxy.

9. The power semiconductor package of claim 1, wherein the at least one beam portion extends from a lateral edge of the copper plate and is coupled to the at least one second terminal at a distal end.

10. The power semiconductor package of claim 9, further comprising a layer of curable conductive material disposed between the distal end of the beam portion and the at least one second terminal.

11. The power semiconductor package of claim 9, wherein the at least one second terminal is integral with the at least one beam portion.

12. The power semiconductor package of claim 9, wherein the beam portion is a single member extending from the lateral edge of the copper plate to the at least one second terminal.

13. The power semiconductor package of claim 9, comprising at least two beam portions extending from the lateral edge of the copper plate and terminating at the at least one second terminal.

14. The power semiconductor package of claim 13, wherein the at least two beam portions extend from the lateral edge of the copper plate to a cross bar portion, the cross bar portion being coupled to at least two second terminals.

15. The power semiconductor package of claim 14, further comprising a layer of curable conductive material disposed for coupling the cross bar portion to the second terminals.

16. The power semiconductor package of claim 15, wherein the curable conductive material is silver filled epoxy.

17. The power semiconductor package of claim 14, wherein the cross bar portion includes a void located proximate to the second terminals and sized and shaped to facilitate engagement with the second terminals.

18. The power semiconductor package of claim 17, wherein the void is in the form of a channel extending substantially a length of the cross bar portion.

19. The power semiconductor package of claim 18, further comprising curable conductive material disposed within the channel to couple the cross bar portion to the second terminals.

20. The power semiconductor package of claim 19, further comprising a downwardly directed projection extending through the channel toward the second terminals.

21. The power semiconductor package of claim 20, wherein the projection is in the form of a wall extending substantially the length of the cross bar portion.

22. The power semiconductor package of claim 21, further comprising a curable conductive material disposed within the void to couple the cross bar portion to the second terminals.

23. The power semiconductor package of claim 22, wherein the curable conductive material is silver filled epoxy.

24. The power semiconductor package of claim 1, wherein the package is sized and shaped to conform to an S08 package configuration.

25. The power semiconductor package of claim 1, wherein the package includes a plastic housing which substantially encapsulates the bottom leadframe, semiconductor die and copper plate.

26. A power semiconductor package, comprising:

a bottom leadframe having a bottom plate portion and at least one first terminal extending from the bottom plate portion;

at least one second terminal being co-planar with the first terminal;

a semiconductor power MOSFET die having a top surface on which a first metalized region defining a source and a second metalized region defining a gate are disposed, the top surface further including a gate bus extending over portions of the source, the MOSFET die further including a bottom surface defining a drain connection coupled to the bottom plate of the leadframe such that the first terminal is electrically connected to the drain;

a nitride layer substantially covering at least a portion of the gate bus;

a layer of curable conductive material disposed atop the nitride layer and the source;

a copper plate coupled to and spanning a substantial part of the source and covering substantially all of the gate bus, the curable conductive material electrically coupling the copper plate to the source but being electrically insulated from the gate bus via the nitride layer;

at least one beam portion being sized and shaped to couple the copper plate portion to the at least one second terminal such that it is electrically coupled to the source; and a wire bond coupling the gate to a third terminal.

27. The power semiconductor package of claim 26, wherein the curable conductive material is silver filled epoxy.

28. The power semiconductor package of claim 26, wherein the at least one beam portion extends from a lateral edge of the copper plate and is coupled to the at least one second terminal at a distal end.

* * * * *

UNITED STATES PATENT AND TRADEMARK OFFICE
CERTIFICATE OF CORRECTION

| | |
|---|---|
| PATENT NO. | : 6,040,626 C1 |
| APPLICATION NO. | : 90/006727 |
| DATED | : December 1, 2009 |
| INVENTOR(S) | : Cheah et al. |

It is certified that error appears in the above-identified patent and that said Letters Patent is hereby corrected as shown below:

Title Page [73] Assignee, "Banque Nationale de Paris, Los Angeles, CA (US)" should be changed to -- International Rectifier Corporation, El Segundo, CA (US) --.

Signed and Sealed this

Sixteenth Day of February, 2010

David J. Kappos
*Director of the United States Patent and Trademark Office*

(12) EX PARTE REEXAMINATION CERTIFICATE (7201st)
United States Patent
Cheah et al.

(10) Number: US 6,040,626 C1
(45) Certificate Issued: Dec. 1, 2009

(54) SEMICONDUCTOR PACKAGE

(75) Inventors: Chuan Cheah, El Segundo, CA (US); Jorge Munoz, Cypress, CA (US); Dan Kinzer, El Segundo, CA (US)

(73) Assignee: Banque Nationale de Paris, Los Angeles, CA (US)

Reexamination Request:
No. 90/006,727, Jul. 28, 2003
No. 90/007,073, Jun. 9, 2004

Reexamination Certificate for:
Patent No.: 6,040,626
Issued: Mar. 21, 2000
Appl. No.: 09/225,153
Filed: Jan. 4, 1999

Related U.S. Application Data

(60) Provisional application No. 60/101,810, filed on Sep. 25, 1998.

(51) Int. Cl.
*H01L 23/495* (2006.01)
*H01L 23/48* (2006.01)

(52) U.S. Cl. ................. 257/735; 257/341; 257/666; 257/692; 257/E23.044

(58) Field of Classification Search .................. None
See application file for complete search history.

(56) References Cited

U.S. PATENT DOCUMENTS

| | | | |
|---|---|---|---|
| 3,492,547 A | * | 1/1970 | Recko et al. ............... 257/695 |
| 3,893,158 A | | 7/1975 | Lincoln |
| 3,950,651 A | * | 4/1976 | Flocee ........................ 378/147 |
| 4,176,443 A | | 12/1979 | Iannuzzi et al. |
| 4,546,374 A | * | 10/1985 | Olsen et al. ................. 257/772 |
| 4,639,835 A | | 1/1987 | Daubresse |
| 4,766,479 A | * | 8/1988 | Krum et al. ................. 257/737 |
| 4,881,773 A | * | 11/1989 | Ichinose ................ 296/216.09 |
| 4,935,803 A | * | 6/1990 | Kalfus et al. ................. 257/673 |

(Continued)

FOREIGN PATENT DOCUMENTS

| DE | WO 98/03998 | 1/1998 |
|---|---|---|
| EP | 0 295 459 | 5/1988 |
| JP | 3-57251 | 3/1991 |
| JP | 08139241 | 5/1996 |

OTHER PUBLICATIONS

Odian, Principles of Polymerization, second edition, John Wiley & Sons, 1981, p. 133.*
A New High Power IC Surface Mount Package Family: Powers0–20™ & Powers0–26 Power IC Packaging from insertion to Surface Mounting—P. Casati & C. Cognetti pp. 1–19—Jul. 2001.
Thermal Management in Surface Mounting—pp. 1–16—Dec. 2003.
English abstract for JP 08–148,623 A, Jun. 1996.
English abstract for JP 08–148,621 A, Jun. 1996.
English abstract for JP 09–129796, May 1997.
Exhibit 1—Webster's Ninth New Collegiate Dictionary—3 pages—definition for "Extend" (1985).
Exhibit 2—Webster's Ninth New Collegiate Dictionary—3 pages—definition for "Between" (1985).

*Primary Examiner*—Alan Diamond

(57) ABSTRACT

A semiconductor package includes a bottom leadframe having a bottom plate portion and at least one first terminal extending from the bottom plate portion; at least one second terminal being co-planar with the first terminal; a semiconductor power MOSFET die having a bottom surface defining a drain connection and a top surface on which a first metalized region defining a source and a second metalized region defining a gate are disposed, the bottom surface being coupled to the bottom plate of the leadframe such that the first terminal is electrically connected to the drain; a copper plate coupled to and spanning a substantial part of the first metalized region defining the source connection; and at least one beam portion being sized and shaped to couple the copper plate portion to the at least one second terminal such that it is electrically coupled to the source.

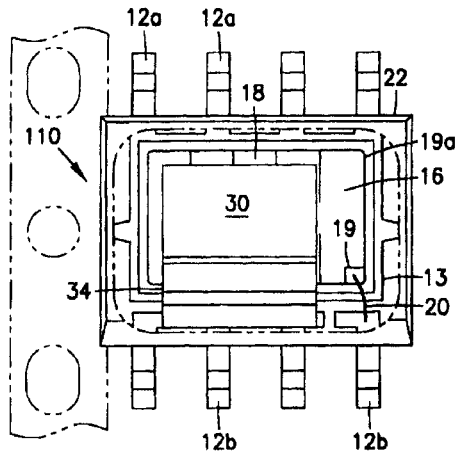

U.S. PATENT DOCUMENTS

| | | |
|---|---|---|
| 5,028,987 A | 7/1991 | Neugebauer et al. |
| 5,119,169 A | 6/1992 | Kozono et al. |
| 5,145,800 A | 9/1992 | Arai et al. |
| 5,262,336 A * | 11/1993 | Pike, Jr. et al. ............... 438/138 |
| 5,461,255 A | 10/1995 | Chan et al. |
| 5,481,203 A | 1/1996 | Appold |
| 5,498,907 A | 3/1996 | Tumpey et al. |
| 5,544,412 A | 8/1996 | Romero et al. |
| 5,550,401 A | 8/1996 | Maeda |
| 5,559,373 A | 9/1996 | Applebaum |
| 5,614,759 A | 3/1997 | Vandenheuvel et al. |
| 5,625,226 A | 4/1997 | Kinzer |
| 5,631,476 A | 5/1997 | Ferla et al. |
| 5,637,922 A | 6/1997 | Fillion et al. |
| 5,665,996 A * | 9/1997 | Williams et al. ............ 257/401 |
| 5,814,180 A * | 9/1998 | King ........................ 156/333 |
| 5,895,974 A * | 4/1999 | Eytcheson et al. .......... 257/723 |
| 5,940,721 A * | 8/1999 | Kinzer et al. ............... 438/454 |
| 6,014,066 A * | 1/2000 | Harberts et al. ............ 333/104 |
| 6,249,041 B1 | 6/2001 | Kasem et al. |

* cited by examiner

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 26-28 is confirmed.

Claims 1, 2, 4 and 9-25 are cancelled.

Claims 3 and 5 are determined to be patentable as amended.

Claims 6-8, dependent on an amended claim, are determined to be patentable.

3. [The power semiconductor package of claim 1.] *A power semiconductor package, comprising:*
   a bottom leadframe having a bottom plate portion and at least one first terminal extending from the bottom plate portion;
   at least one second terminal being co-planar with the first terminal;
   a third terminal;
   a semiconductor power MOSFET die having a bottom surface defining a drain connection and a top surface on which a first metalized region defining a source and a second metalized region defining a gate are disposed, the bottom surface being coupled to the bottom plate of the leadframe such that the first terminal is electrically connected to the drain;
   a copper plate coupled to and spanning a substantial part of the first metalized region defining the source connection;
   at least one beam portion being sized and shaped to couple the copper plate portion to the at least one second terminal such that it is electrically coupled to the source;
   a wire bond coupling the gate to the third terminal; and
   a housing comprised of moldable material encapsulating the semiconductor die and extending to and disposed on the copper plate, wherein the at least one first terminal is electrically connected to the bottom plate portion and extends out of the housing, wherein the copper plate includes a top surface and a bottom surface, the bottom surface having downwardly directed projections extending towards the source.

5. [The power semiconductor package of claim 1.] *A power semiconductor package, comprising:*
   *a bottom leadframe having a bottom plate portion and at least one first terminal extending from the bottom plate portion;*
   *at least one second terminal being co-planar with the first terminal;*
   *a third terminal;*
   *a semiconductor power MOSFET die having a bottom surface defining a drain connection and a top surface on which a first metalized region defining a source and a second metalized region defining a gate are disposed, the bottom surface being coupled to the bottom plate of the leadframe such that the first terminal is electrically connected to the drain;*
   *a copper plate coupled to and spanning a substantial part of the first metalized region defining the source connection;*
   *at least one beam portion being sized and shaped to couple the copper plate portion to the at least one second terminal such that is electrically coupled to the source;*
   *a wire bond coupling the gate to the third terminal; and*
   *a housing comprised of moldable material encapsulating the semiconductor die and extending to and disposed on the copper plate, wherein the at least one first terminal is electrically connected to the bottom plate portion and extends out of the housing,* wherein the MOSFET die includes a gate bus extending over portions of the source, further comprising a nitride layer substantially covering at least a portion of the gate bus, the copper plate being electrically insulated from the gate bus via the nitride layer.

* * * * *